US012700434B2

(12) United States Patent
Sato et al.

(10) Patent No.: US 12,700,434 B2
(45) Date of Patent: Aug. 4, 2026

(54) SEMICONDUCTOR MEMORY DEVICE

(71) Applicant: Tokyo Electron Limited, Tokyo (JP)

(72) Inventors: Motoyuki Sato, Tokyo (JP); Kiyotaka Imai, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 152 days.

(21) Appl. No.: 18/828,820

(22) Filed: Sep. 9, 2024

(65) Prior Publication Data

US 2025/0006229 A1     Jan. 2, 2025

Related U.S. Application Data

(63) Continuation of application No. PCT/JP2023/010549, filed on Mar. 17, 2023.

(30) Foreign Application Priority Data

Mar. 29, 2022    (JP) ................................. 2022-054659

(51) Int. Cl.
    *G11C 5/06*        (2006.01)
    *H10B 12/00*       (2023.01)
(52) U.S. Cl.
    CPC ........... *G11C 5/063* (2013.01); *H10B 12/482* (2023.02); *H10B 12/488* (2023.02)
(58) Field of Classification Search
    CPC .... G11C 5/063; H10B 12/482; H10B 12/488; H10B 43/27; H10B 43/40; H10B 12/00; H10B 43/50; H10B 80/00; H10W 90/00; H10W 72/071
    See application file for complete search history.

(56) References Cited

U.S. PATENT DOCUMENTS

| | | | |
|---|---|---|---|
| 2020/0105735 A1* | 4/2020 | Park ....................... | H10D 88/00 |
| 2020/0176420 A1 | 6/2020 | Or-Bach et al. | |
| 2021/0249415 A1 | 8/2021 | Kang et al. | |
| 2021/0391315 A1 | 12/2021 | Zhang | |
| 2022/0052010 A1* | 2/2022 | Goda .................... | H10W 70/60 |
| 2023/0207505 A1* | 6/2023 | Simsek-Ege ........ | G11C 11/4085 257/296 |
| 2023/0320072 A1* | 10/2023 | Sukekawa .............. | H10B 12/50 257/296 |
| 2026/0059738 A1* | 2/2026 | Lee ......................... | H10B 12/30 |

* cited by examiner

*Primary Examiner* — Jerome Leboeuf
(74) *Attorney, Agent, or Firm* — PROCOPIO, CORY, HARGREAVES & SAVITCH LLP

(57)     ABSTRACT

Provided is a semiconductor memory device including a first die and a second die disposed on the first die. The first die includes a substrate, a memory cell array having a plurality of memory cells disposed along a first direction perpendicular to a main surface of the substrate, a plurality of first conductive lines electrically connected to the memory cell array and extending in the first direction, the first conductive lines being bit lines or word lines, and a bonding layer having a plurality of bonding pads electrically connected to the plurality of first conductive lines, respectively. At least one of the plurality of bonding pads is provided at a position shifted from the first conductive line to which the at least one bonding pad is connected, when viewed from the first direction. The second die is provided on the bonding layer.

20 Claims, 9 Drawing Sheets

200(PCR)

PCR(PCR1)

BP2

CL3

CL1

WL

MC

BP1

TR     CP

WL

PCR(PCR2)

WL

WL

CL4     CL2

BL     BL     BL     BL 100
(MCA)

100

BP1

103

102

101

D1

D2(D3)

200

BP2

203

202

201

D1

D2(D3)

100

MCA

PL(PL1)

CL1
CL10 CL12

BP1
(BP12)

BP1
(BP10)

CL1(CL10)

CL1
CL10 CL12

BP1
(BP12)

PL(PL2)

101

CP

TR

WL(WL1)

MC(MC1)

BL

WL(WL2)

CP  TR

MC(MC2)

S

D3

D1

D2

SEMICONDUCTOR MEMORY DEVICE

CROSS-REFERENCE TO RELATED APPLICATIONS

This application is a bypass continuation application of international application No. PCT/JP2023/010549 having an international filing date of Mar. 17, 2023 and designating the United States, the international application being based upon and claiming the benefit of priority from Japanese Patent Application No. 2022-054659, filed on Mar. 29, 2022, the entire contents of which are incorporated herein by reference.

TECHNICAL FIELD

An exemplary embodiment of the present disclosure relates to a semiconductor memory device.

BACKGROUND

US2021/0391315A discloses a technique of joining a first semiconductor structure and a second semiconductor structure by bonding.

SUMMARY

In one exemplary embodiment of the present disclosure, there is provided a semiconductor memory device including: a first die; and a second die disposed on the first die. The first die includes a substrate, a memory cell array having a plurality of memory cells disposed along a first direction perpendicular to a main surface of the substrate, a plurality of first conductive lines electrically connected to the memory cell array and extending in the first direction, the first conductive lines being bit lines or word lines, and a bonding layer having a plurality of bonding pads electrically connected to the plurality of first conductive lines, respectively, at least one of the plurality of bonding pads being provided at a position shifted from the first conductive line to which the at least one bonding pad is connected, when viewed from the first direction, and the second die is provided on the bonding layer.

DETAILED DESCRIPTION

Figure 1:
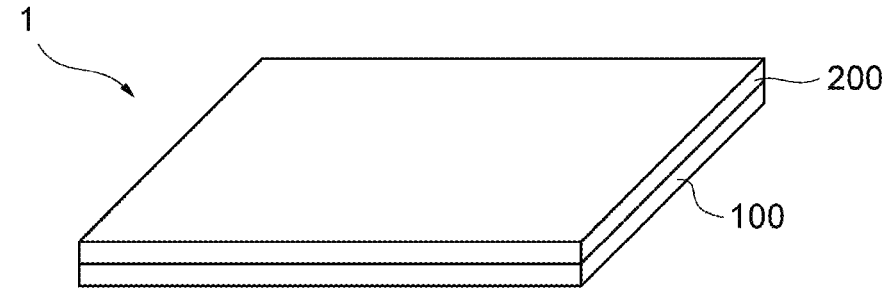
FIG. 1 is a diagram schematically illustrating a configuration of a semiconductor memory device 1 according to an exemplary embodiment.
Figure 1:
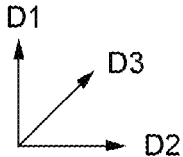

Hereinafter, embodiments of the present disclosure will be described.

In one exemplary embodiment, there is provided a semiconductor memory device including: a first die; and a second die disposed on the first die. The first die includes a substrate, a memory cell array having a plurality of memory cells disposed along a first direction perpendicular to a main surface of the substrate, a plurality of first conductive lines electrically connected to the memory cell array and extending in the first direction, the first conductive lines being bit lines or word lines, and a bonding layer having a plurality of bonding pads electrically connected to the plurality of first conductive lines, respectively, at least one of the plurality of bonding pads being provided at a position shifted from the first conductive line to which the at least one bonding pad is connected, when viewed from the first direction, and the second die is provided on the bonding layer.

In one exemplary embodiment, at least another one of the plurality of bonding pads is provided at a position overlapping the memory cell array, when viewed from the first direction.

In one exemplary embodiment, at least another one of the plurality of bonding pads is provided at a position overlapping the first conductive line to which the at least another bonding pad is connected, when viewed from the first direction.

In one exemplary embodiment, a pitch between the bonding pads closest to each other when viewed from the first direction is greater than a pitch between the first conductive lines closest to each other when viewed from the first direction.

One exemplary embodiment further includes a plurality of contact lines that electrically connect the plurality of first conductive lines and the corresponding bonding pads, respectively.

In one exemplary embodiment, at least one of the plurality of contact lines has a part extending in a direction parallel to the main surface of the substrate and a part extending in the first direction.

In one exemplary embodiment, at least one of the plurality of contact lines extends only in the first direction.

In one exemplary embodiment, the pitch between the bonding pads is 500 nm or more.

In one exemplary embodiment, the pitch between the first conductive lines is less than 500 nm.

In one exemplary embodiment, the memory cell array has a plurality of memory cells extending in a second direction parallel to the main surface of the substrate, and the memory cells are spaced apart from one another along a third direction parallel to the main surface of the substrate and orthogonal to the second direction.

In one exemplary embodiment, the first conductive lines are spaced apart from one another along the third direction.

One exemplary embodiment further includes a plurality of second conductive lines electrically connected to the memory cell array and extending in the third direction, wherein the second conductive lines are word lines when the first conductive lines are the bit lines, and are bit lines when the first conductive lines are the word lines.

In one exemplary embodiment, the second conductive lines are spaced apart from one another along the first direction.

In one exemplary embodiment, the plurality of second conductive lines are disposed in a stepped manner at one end in the third direction.

In one exemplary embodiment, a plurality of bonding pads electrically connected to the plurality of second conductive lines are formed in the bonding layer, and each of the bonding pads is connected to an end portion of the corresponding second conductive line through the contact lines.

In one exemplary embodiment, at least one of the contact lines has a part extending in a direction parallel to the main surface of the first substrate and a part extending in the first direction.

In one exemplary embodiment, at least one of the contact lines extends only in the first direction.

In one exemplary embodiment, the memory cell array has first memory cells provided on one side of the plurality of first conductive lines in the second direction, and second memory cells provided on the other side of the plurality of first conductive lines in the second direction.

In one exemplary embodiment, the memory cell has a MOS transistor and a capacitor.

In one exemplary embodiment, the second die includes a bonding layer disposed on the bonding layer of the first die and having a plurality of second bonding pads bonded to the bonding pads of the first die, a circuit electrically connected to the plurality of second bonding pads, and a substrate provided on the circuit.

Hereinafter, each embodiment of the present disclosure will be described in detail with reference to the drawings. In the drawings, the same or similar elements are denoted by the same reference numerals, and overlapping descriptions thereof will be omitted. Unless otherwise specified, a positional relationship of up/down, left/right, or the like will be described based on a positional relationship illustrated in the drawings. The dimensional ratios in the drawings do not indicate actual ratios, and the actual ratios are not limited to the illustrated ratios.

FIG. 1 is a diagram schematically illustrating a configuration of the semiconductor memory device 1 according to an exemplary embodiment. The semiconductor memory device 1 has a first die 100 and a second die 200 provided on the first die 100. The second die 200 is provided in a first direction D1 perpendicular to a main surface of the first die 100. The main surface of the first die 100 is a surface lying in a second direction D2 and a third direction D3 orthogonal to the second direction D2.

Figure 2:
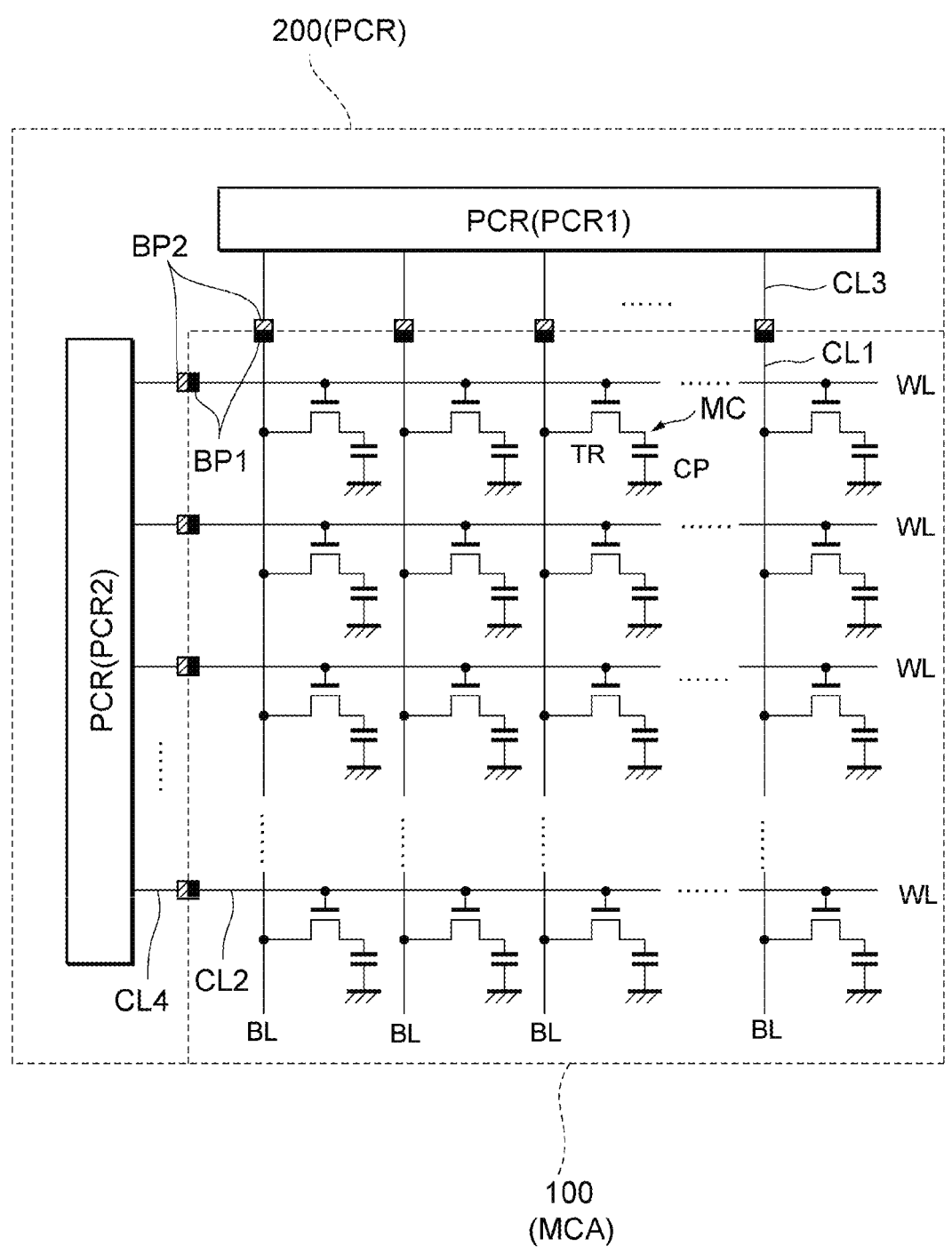
FIG. 2 is a diagram schematically illustrating a circuit configuration of the semiconductor memory device 1.

FIG. 2 is a diagram schematically illustrating a circuit configuration of the semiconductor memory device 1. As shown in FIG. 2, the first die 100 may include a memory cell array MCA. The memory cell array MCA has a plurality of memory cells MC. Each memory cell MC may be a DRAM memory cell having a MOS transistor TR and a capacitor CP. A bit line BL is connected to a source of the MOS transistor TR of each memory cell MC. A word line WL is connected to a gate of the MOS transistor TR of each memory cell MC. The bit line BL and the word line WL are electrically connected to a bonding pad BP1 provided in the first die 100 through a contact line CL1 and a contact line CL2, respectively. The bonding pad BP1 is a pad that electrically connects a circuit included in the first die 100 to an outside of the first die 100.

The first die 100 may have the plurality of memory cell arrays MCA. The MOS transistor TR included in each memory cell MC may be a MOS transistor having a so-called three-dimensional structure.

The second die 200 includes at least a part of a circuit included in the semiconductor memory device 1. As an example, the second die 200 may include a peripheral circuit PCR that writes and reads data into and from the memory cell array MCA of the first die 100. The peripheral circuit PCR may include a sense amplifier circuit PCR1 and a word line driver circuit PCR2.

The sense amplifier circuit PCR1 is electrically connected to a bonding pad BP2 through a contact line CL3. The bonding pad BP2 of the second die 200 is electrically connected to the bonding pad BP1 of the first die 100. That is, the sense amplifier circuit PCR1 is electrically connected to the bit line BL of the first die 100.

The word line driver circuit PCR2 is electrically connected to the bonding pad BP2 provided in the second die 200 through a contact line CL4. The bonding pad BP2 of the second die 200 is electrically connected to the bonding pad BP1 of the first die 100. That is, the word line driver circuit PCR2 is electrically connected to the word line WL of the first die 100.

The peripheral circuit PCR included in the second die 200 may additionally include, for example, an address decoder circuit, a buffer circuit that temporarily stores data, a circuit that performs parallel/serial conversion, and/or an interface circuit that communicates with an external controller. In an example, the peripheral circuit PCR may be implemented by a CMOS circuit.

Figures 3A, 3B:
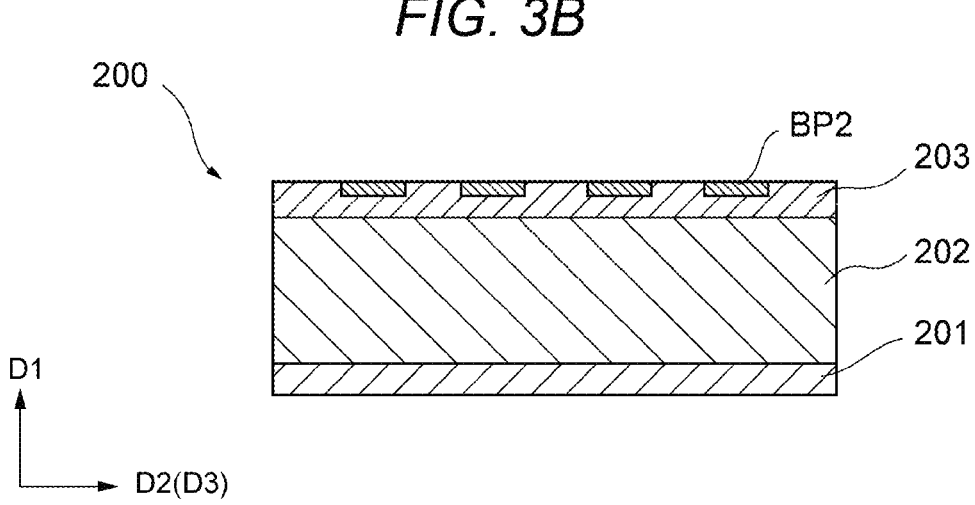
FIG. 3A is a diagram illustrating a method for manufacturing the semiconductor memory device 1.
FIG. 3B is a diagram illustrating the method for manufacturing the semiconductor memory device 1.

FIGS. 3A to 3D are diagrams illustrating a method for manufacturing the semiconductor memory device 1. First, as shown in FIGS. 3A and 3B, the first die 100 and the second die 200 are prepared, respectively.

As shown in FIG. 3A, the first die 100 may be formed by stacking, on a substrate 101, a circuit layer 102 including the memory cell array MCA and a bonding layer 103 including a plurality of bonding pads BP1 in this order.

As shown in FIG. 3B, the second die 200 may be formed by stacking, on a substrate 201, a circuit layer 202 including the peripheral circuit PCR and a bonding layer 203 including a plurality of bonding pads BP2 in this order.

Figures 3C, 3D:
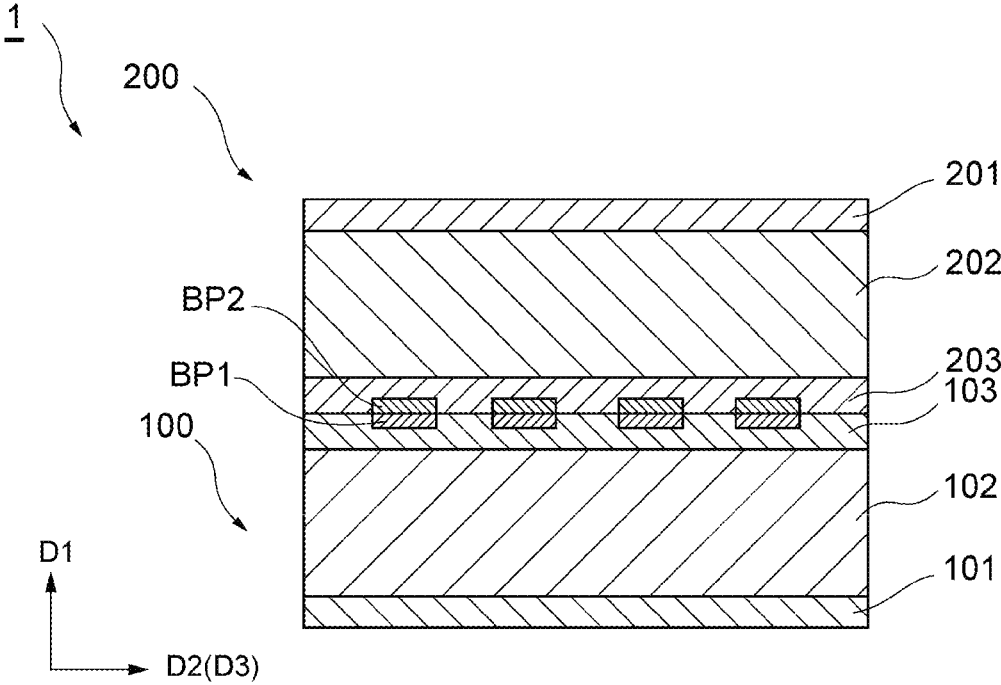
FIG. 3C is a diagram illustrating the method for manufacturing the semiconductor memory device 1.
FIG. 3D is a diagram illustrating the method for manufacturing the semiconductor memory device 1.

Next, as illustrated in FIG. 3C, the second die 200 is disposed above the first die 100 in the first direction D1. At this time, the first die 100 and the second die 200 are disposed so that the bonding pads BP2 of the second die 200 face the bonding pads BP1 of the first die 100.

Next, as shown in FIG. 3D, the first die 100 and the second die 200 are aligned such that the bonding pads BP1 of the first die 100 and the corresponding bonding pads BP2 of the second die 200 come into contact with each other. Then, the bonding layer 103 and the bonding layer 203 are bonded by thermocompression bonding or the like. Accordingly, the first die 100 and the second die 200 are bonded to each other to form the semiconductor memory device 1. During the bonding, an interface between the bonding layer 103 and the bonding layer 203 may be activated through plasma processing. In addition, bonding may be performed using an adhesive.

Figure 4:
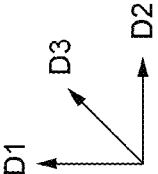
FIG. 4 is a perspective view schematically illustrating an example of a structure of a first die 100 according to the exemplary embodiment.

FIG. 4 is a perspective view schematically illustrating an example of a structure of the first die 100 according to the exemplary embodiment. The first die 100 may have the memory cell array MCA having a three-dimensional structure. The first die 100 may have a dielectric film and other configuration, in addition to the configurations shown in FIGS. 4 to 8. In FIGS. 4 to 8, for the sake of convenience of description, the present embodiment will be described with reference to a part of the configuration of the first die 100.

As shown in FIG. 4, the first die 100 includes the substrate 101, a plurality of bit lines BL, a plurality of word lines WL, the memory cell array MCA, a conductive film PL, the plurality of bonding pads BP1, and a plurality of contact lines CL1. The bit lines BL, the word lines WL, the memory cell array MCA, and the conductive film PL may be included in the circuit layer 102 in FIG. 3D. The bonding pads BP1 may be included in the bonding layer 103 in FIG. 3D. The contact lines CL1 may be provided across the circuit layer 102 and the bonding layer 103 in FIG. 3D. In the first die 100, the configuration illustrated in FIG. 4 may be regarded as one unit, and a plurality of such units may be arranged in the second direction D2. In this case, the conductive film PL may be shared between adjacent units.

The substrate 101 may be formed, for example, by stacking a plurality of films on a silicon wafer. The substrate 101 may include an organic film, an insulating film, a metal film, a semiconductor film, or the like. A film forming a main surface S of the substrate 101 may be an insulating film. The main surface S is a surface defined by the second direction D2 and the third direction D3 orthogonal to the second direction D2. The main surface S constitutes a main surface of the first die 100.

The bit lines BL are provided on the main surface S of the substrate 101. The bit lines BL are provided along the first direction D1 perpendicular to the main surface S of the substrate 101. The bit lines BL may be conductive films having a line shape or a rod shape. The bit lines BL may be spaced apart from each other at equal intervals along the third direction D3.

The word lines WL are provided on the main surface S of the substrate 101. The word lines WL are provided along the third direction D3. The word lines WL may be, for example, conductive films having a line shape or a rod shape.

The word lines WL have a plurality of word lines WL1 and a plurality of word lines WL2. The word lines WL1 and the word lines WL2 are provided to face each other in the second direction D2 with the bit lines BL sandwiched therebetween. The word lines WL1 are arranged on one side of the bit lines BL in the second direction D2 (right side of a paper surface of FIG. 2). The word lines WL2 are arranged on the other side of the bit lines BL in the second direction D2 (left side of the paper surface of FIG. 2). The word lines WL1 may be spaced apart from each other at equal intervals along the first direction D1. The word lines WL2 may be spaced apart from each other at equal intervals along the first direction D1.

The memory cell array MCA is provided on the main surface S of the substrate 101. The memory cell array MCA is implemented such that a plurality of memory cells MC are arranged in the first direction D1 and the third direction D3. Each memory cell MC is connected to a corresponding word line WL and a corresponding bit line BL. Each memory cell MC is provided at an intersection of the word line WL and the bit line BL in a plane defined by the first direction D1 and the third direction D3. The memory cell MC has a columnar shape extending along the second direction D2. The memory cell MC may include the MOS transistor TR and the capacitor CP. The memory cell array MCA may be the memory cell array MCA illustrated in FIG. 2.

The memory cell array MCA may have memory cells MC1 arranged on the one side of the bit lines BL in the second direction D2 and memory cells MC2 arranged on the other side of the bit lines BL. The MOS transistor TR of the memory cell MC1 is connected to the bit line BL and the word line WL1. The MOS transistor TR of the memory cell MC2 is connected to the bit line BL and the word line WL2. That is, the memory cell MC1 and the memory cell MC2 are connected to a common bit line BL. The capacitor CP of the memory cell MC1 has one electrode connected to the MOS transistor TR and the other electrode connected a the conductive film PL1 provided on the substrate 101. The capacitor CP of the memory cell MC2 has one electrode connected to the MOS transistor TR and the other electrode connected to the conductive film PL2 provided on the substrate 101. The conductive film PL1 and the conductive film PL2 may be provided in an upright manner in a plate shape on the main surface S of the substrate 101.

The memory cell array MCA may not have the memory cell MC2. In this case, the first die 100 does not need to have the word lines WL2 and the conductive film PL2.

The bonding pads BP1 are electrically connected to corresponding bit lines BL through the contact lines CL1, respectively. The bonding pad BP1 may be made of a conductive film, for example, tungsten, cobalt, copper, aluminum, silicide, or a compound thereof. The bonding pad BP1 may have various shapes such as a circle or an ellipse in a plan view. The contact line CL1 may be formed of the same or different type of conductive film as the bonding pad BP1.

The bonding pads BP1 may have a bonding pad BP10 and a bonding pad BP12.

The bonding pad BP10 is provided at a position overlapping the bit line BL to which the bonding pad BP10 is connected, when viewed from the first direction D1 (that is, in a plan view). In other words, the bonding pad BP10 is provided at a position directly above the bit line BL to which the bonding pad BP10 is connected (at a position where the bit line BL extends in the first direction D1). The contact line CL1 connecting the bonding pad BP10 and the bit line BL may have only a part CL10 extending in the first direction D1.

The bonding pad BP12 is provided at a position shifted from (at a position not overlapping) the bit line BL to which the bonding pad BP12 is connected, when viewed in the first direction D1 (that is, in a plan view). In other words, the bonding pad BP12 is not provided at a position directly above the bit line BL to which the bonding pad BP12 is connected. The contact line CL1 connecting the bonding pad BP12 and the bit line BL may have the part CL10 extending in the first direction D1 and a part CL12 extending in the second direction D2. The parts CL12 of the contact lines CL1 (two of which are illustrated in FIG. 4) may be provided on the same plane. In this case, the parts CL12 of the contact lines CL1 may be formed at once.

Figure 5:
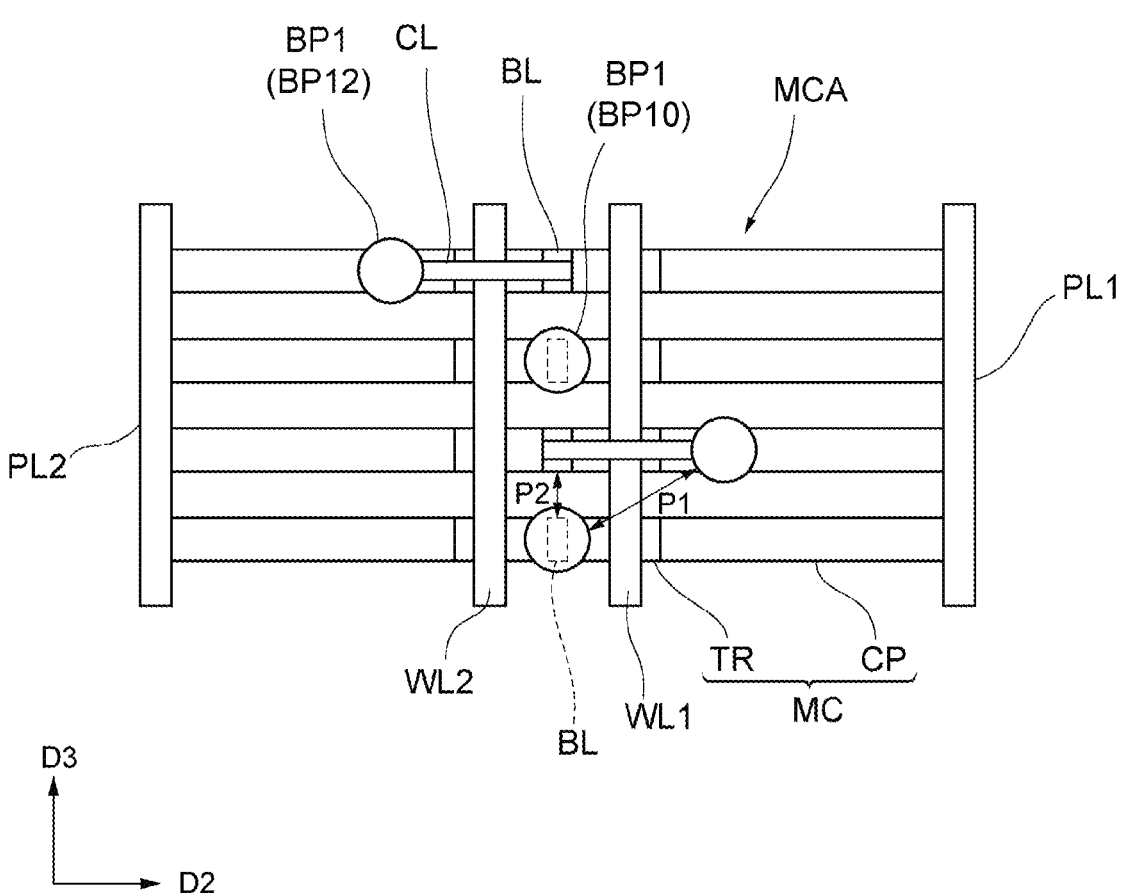
FIG. 5 is a plan view schematically illustrating an example of a disposition of bonding pads BP1 according to the exemplary embodiment.

FIG. 5 is a plan view schematically illustrating an example of a disposition of the bonding pads BP1 according to the exemplary embodiment. In the example shown in FIG. 5, the bonding pads BP10 and BP12 are alternately provided along the third direction D3 that is an arrangement direction of the bit lines BL. That is, the bonding pad BP10 connected to one of the two adjacent bit lines BL is positioned directly above the one bit line BL in a plan view. The bonding pad BP12 connected to the other bit line BL is positioned shifted from the other bit line BL in a plan view.

As shown in FIG. 5, the bonding pad BP12 may be positioned directly above the memory cell array MCA in a plan view. In an example, the bonding pad BP12 may be positioned above the capacitor (CP) of the memory cell MC in a plan view. The bonding pad BP12 may be positioned above the MOS transistor TR of the memory cell MC or above the word lines WL (WL1, WL2) in a plan view. The bonding pad BP12 may be provided at a position offset in the third direction D3 in addition to the second direction D2 in a plan view with respect to the bit line BL to which it is connected.

A pitch P1 between the bonding pads BP1 is greater than a pitch P2 between the bit lines BL. Here, the "pitch P1" is a distance between the closest bonding pads BP1 in a plan view. The "pitch P2" is a distance between the closest (that is, adjacent) bit lines BL in a plan view. In an example, the pitch P1 may be 500 nm or more, 800 nm or more, and 1000 nm or more. In an example, the pitch P2 may be less than 500 nm, less than 400 nm, less than 300 nm, or less than 200 nm. The pitch P1 may be adjusted as appropriate by changing the disposition of the bonding pads BP1 in a plan view.

Here, when the pitch P1 between the bonding pads BP1 becomes small, accuracy required for the alignment between the first die 100 and the second die 200 becomes high, which may result in a bonding defect or make the bonding itself difficult. Therefore, it is necessary to sufficiently secure the pitch P1 between the bonding pads BP1.

In this respect, according to the configuration described above, the pitch between the bonding pads BP1 can be set separately from the pitch P2 between the bit lines BL. Therefore, even if the pitch P2 between the bit lines BL becomes small, the pitch necessary for the bonding can be secured. Accordingly, it is possible to prevent the occurrence of the bonding defect between the first die 100 and the second die 200 and prevent the bonding itself from becoming difficult.

Various modifications may be made to the embodiment of the present disclosure without departing from the scope and gist of the present disclosure.

For example, the disposition of the bonding pads BP1 in a plan view may be appropriately changed.

Figure 6:
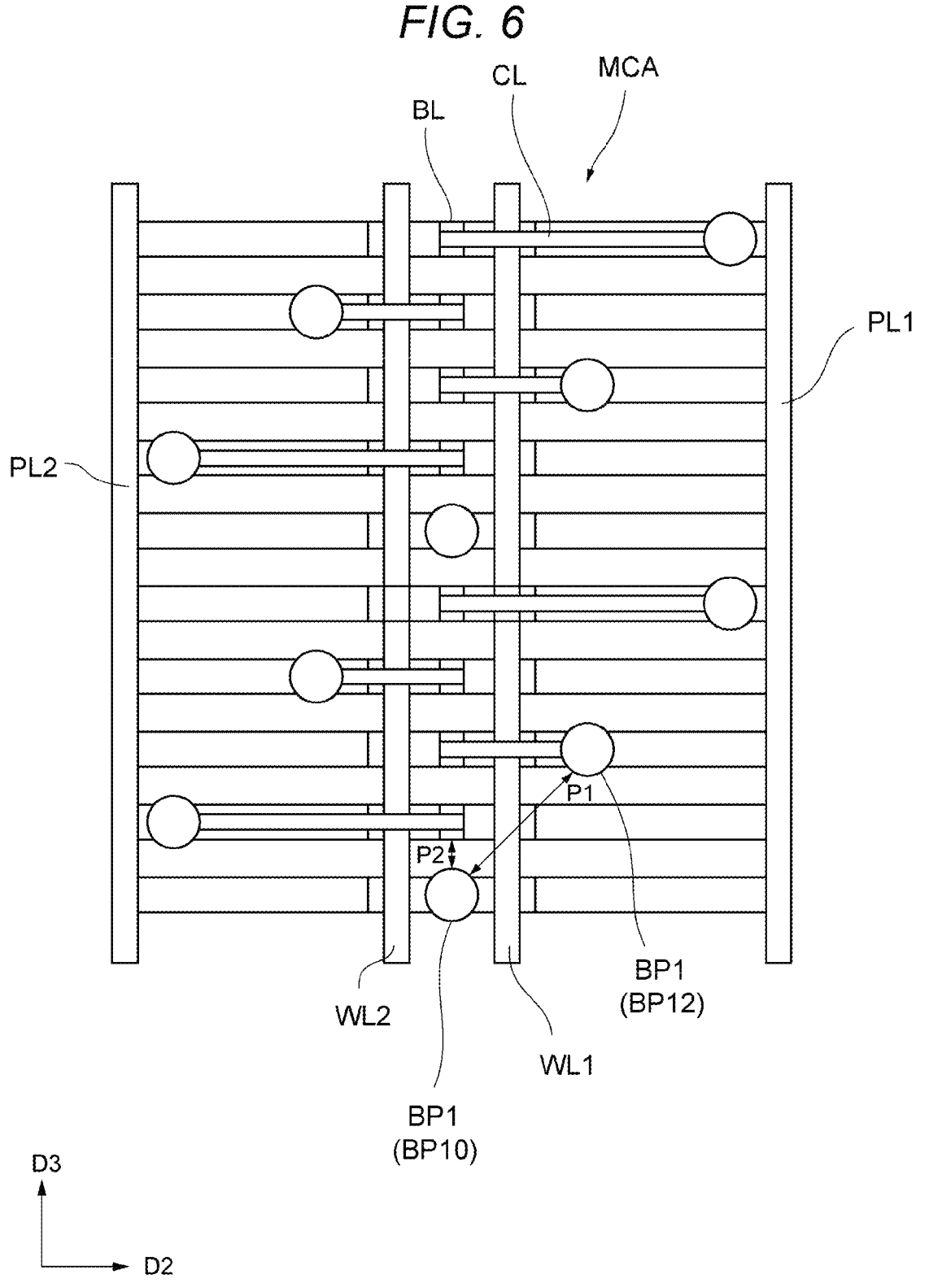
FIG. 6 is a plan view schematically illustrating another example of the disposition of the bonding pads BP1.

FIG. 6 is a plan view schematically illustrating another example of the disposition of the bonding pads BP1. As shown in FIG. 6, the number of bonding pads BP12 may be greater than the number of bonding pads BP10. In the example shown in FIG. 6, along the third direction D3, a set of one bonding pad BP10 and four bonding pads BP12 that are positioned differently from each other in the second direction is periodically provided. In this example as well, the pitch P1 between the bonding pads BP1 is greater than the pitch P2 between the bit lines BL.

Figure 7:
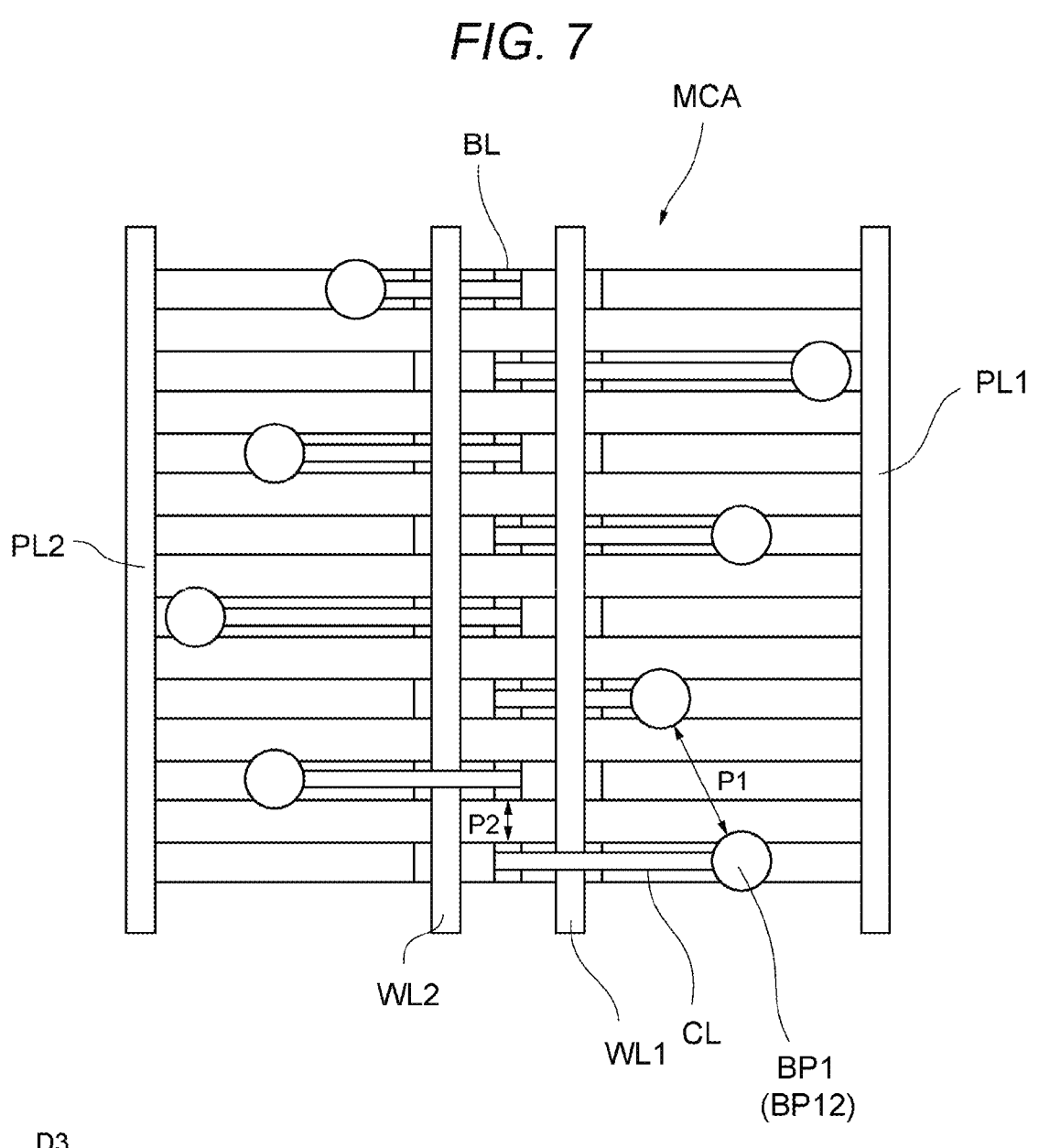
FIG. 7 is a plan view schematically illustrating another example of the disposition of the bonding pads BP1.

FIG. 7 is a plan view schematically illustrating another example of the disposition of the bonding pads BP1. As shown in FIG. 7, the bonding pad BP1 may be implemented by only the bonding pads BP12. That is, the bonding pad BP10 may not be provided. In this example as well, the pitch P1 between the bonding pads BP1 is greater than the pitch P2 between the bit lines BL.

For example, the same configuration as described above may be applied to the bonding pad BP1 (see FIG. 2) that is electrically connected to the word line WL.

Figure 8:
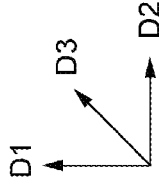
FIG. 8 is a perspective view schematically illustrating another example of the structure of the first die 100.

FIG. 8 is a perspective view schematically illustrating another example of the structure of the first die 100. As shown in FIG. 8, the word lines WL may be disposed in a stepped manner at one end in the third direction D3. The bonding pad BP1 is electrically connected to the word line WL through the contact line CL2. The bonding pad BP1 may be included in the bonding layer 103 in FIG. 2D. The contact line CL2 may be included in the circuit layer 102 and the bonding layer 103 in FIG. 2D.

As shown in FIG. 8, the bonding pads BP1 connected to the respective word lines WL may be a bonding pad BP14 or a bonding pad BP16.

The bonding pad BP14 is provided at a position overlapping the word line WL to which the bonding pad BP14 is connected, when viewed from the first direction D1 (that is, in a plan view). In other words, the bonding pad BP14 is provided at a position directly above the word line WL to which the bonding pad BP14 is connected. The contact line CL2 connecting the bonding pad BP14 and the word line WL may have only a part CL20 extending in the first direction D1.

The bonding pad BP16 is provided at a position shifted from (at a position not overlapping) the word line WL to which the bonding pad BP16 is connected, when viewed from the first direction D1 (that is, in a plan view). In other words, the bonding pad BP16 is not provided at a position directly above the word line WL to which the bonding pad BP16 is connected. The contact line CL2 connecting the bonding pad BP16 and the word line WL may have the part CL20 and a part CL24 extending in the first direction D1, and a part CL22 extending in the second direction D2. The part CL22 of the contact line CL2 may be provided on the same plane as the part CL12 of the contact line CL1. In this case, the part CL12 of the contact line CL1 and the part CL22 of the contact line CL2 may be formed at the same time.

According to the configuration described above, the pitch between the bonding pads BP14 and BP16 can be made greater than the pitch between the part CL20 and the part CL24 of the contact line CL2 connected to the bonding pads BP14 and BP16. Accordingly, for example, even if the stepped structure at one end of the word line WL becomes smaller in the third direction D3, and the pitch between the parts CL20 and CL24 becomes smaller, the pitch required for the bonding may be secured. Accordingly, it is possible to prevent the occurrence of the bonding defect between the first die 100 and the second die 200 and prevent the bonding itself from becoming difficult.

In addition, for example, in the first die 100, the bit line BL and the word line WL may extend in different directions. For example, the word line WL may extend in the first direction D1, and the bit line BL may extend in the third direction D3. In this case, the same configuration as that of the bonding pads BP10 and BP12 of the bit lines BL described with reference to FIGS. 4 to 7 may be applied to the word line WL. In addition, the same configuration as that of the bonding pads BP14 and BP16 of the word lines WL described in FIG. 8 may be applied to the bit lines BL.

According to one exemplary embodiment of the present disclosure, a technique of preventing a bonding defect can be provided.

Each of the above embodiments has been described for the purpose of description, and is not intended to limit the scope of the present disclosure. Each of the above embodiments may be modified in various ways without departing from the scope and gist of the present disclosure. For example, some components in one embodiment are able to be added to other embodiments. In addition, some components in one embodiment are able to be replaced with corresponding components in other embodiments.

The invention claimed is:

1. A semiconductor memory device comprising: a first die; and a second die disposed on the first die, wherein
   the first die includes
   a substrate,
   a memory cell array having a plurality of memory cells
       disposed along a first direction perpendicular to a main
       surface of the substrate, a plurality of first conductive lines electrically connected to the memory cell array and extending in the first direction, the first conductive lines being bit lines or word lines, and a bonding layer having a plurality of bonding pads electrically connected to the plurality of first conductive lines, respectively, at least one of the plurality of bonding pads being provided at a position shifted from the first conductive line to which the at least one bonding pad is connected, when viewed from the first direction, and the second die is provided on the bonding layer.

2. The semiconductor memory device according to claim 1, wherein at least another one of the plurality of bonding pads is provided at a position overlapping the memory cell array, when viewed from the first direction.

3. The semiconductor memory device according to claim 1, wherein at least another one of the plurality of bonding pads is provided at a position overlapping the first conductive line to which the at least another bonding pad is connected, when viewed from the first direction.

4. The semiconductor memory device according to claim 1, wherein a pitch between the bonding pads closest to each other when viewed from the first direction is greater than a pitch between the first conductive lines closest to each other when viewed from the first direction.

5. The semiconductor memory device according to claim 1, further comprising: a plurality of contact lines that electrically connect the plurality of first conductive lines and the corresponding bonding pads, respectively.

6. The semiconductor memory device according to claim 5, wherein at least one of the plurality of contact lines has a part extending in a direction parallel to the main surface of the substrate and a part extending in the first direction.

7. The semiconductor memory device according to claim 6, wherein at least one of the plurality of contact lines extends only in the first direction.

8. The semiconductor memory device according to claim 4, wherein the pitch between the bonding pads is 500 nm or more.

9. The semiconductor memory device according to claim 4, wherein the pitch between the first conductive lines is less than 500 nm.

10. The semiconductor memory device according to claim 1, wherein the memory cell array has a plurality of memory cells extending in a second direction parallel to the main surface of the substrate, and the memory cells are spaced apart from one another along a third direction parallel to the main surface of the substrate and orthogonal to the second direction.

11. The semiconductor memory device according to claim 10, wherein the first conductive lines are spaced apart from one another along the third direction.

12. The semiconductor memory device according to claim 10, further comprising: a plurality of second conductive lines electrically connected to the memory cell array and extending in the third direction, wherein the second conductive lines are word lines when the first conductive lines are the bit lines, and are the bit lines when the first conductive lines are the word lines.

13. The semiconductor memory device according to claim 12, wherein the second conductive lines are spaced apart from one another along the first direction.

14. The semiconductor memory device according to claim 13, wherein the plurality of second conductive lines are disposed in a stepped manner at one end in the third direction.

15. The semiconductor memory device according to claim 14, wherein a plurality of bonding pads electrically connected to the plurality of second conductive lines are formed in the bonding layer, and each of the bonding pad is connected to an end portion of the corresponding second conductive lines through the contact lines.

16. The semiconductor memory device according to claim 15, wherein at least one of the contact lines has a part extending in a direction parallel to the main surface of the first substrate and a part extending in the first direction.

17. The semiconductor memory device according to claim 16, wherein at least one of the contact lines extends only in the first direction.

18. The semiconductor memory device according to claim 10, wherein the memory cell array has first memory cells provided on one side of the plurality of first conductive lines in the second direction, and second memory cells provided on the other side of the plurality of first conductive lines in the second direction.

19. The semiconductor memory device according to claim 10, wherein the memory cell has a MOS transistor and a capacitor.

20. The semiconductor memory device according to claim 1, wherein the second die includes a bonding layer disposed on the bonding layer of the first die and having a plurality of second bonding pads bonded to the bonding pads of the first die, a circuit electrically connected to the plurality of second bonding pads, and a substrate provided on the circuit.

* * * * *